United States Patent
Agarwal et al.

(10) Patent No.: US 6,943,392 B2
(45) Date of Patent: *Sep. 13, 2005

(54) CAPACITORS HAVING A CAPACITOR DIELECTRIC LAYER COMPRISING A METAL OXIDE HAVING MULTIPLE DIFFERENT METALS BONDED WITH OXYGEN

(75) Inventors: Vishnu K. Agarwal, Boise, ID (US); Husam N. Al-Shareef, Austin, TX (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/388,063

(22) Filed: Aug. 30, 1999

(65) Prior Publication Data

US 2001/0054733 A1 Dec. 27, 2001

(51) Int. Cl.[7] .......................... H01L 29/76; H01L 29/94; H01L 31/062; H01L 31/113; H01L 31/119
(52) U.S. Cl. ...................... 257/295; 257/296; 257/310; 257/313
(58) Field of Search .................... 257/295, 310, 257/296, 309

(56) References Cited

U.S. PATENT DOCUMENTS

| | | |
|---|---|---|
| 4,105,810 A | 8/1978 | Yamazaki et al. |
| 4,261,698 A | 4/1981 | Carr et al. |
| 4,691,662 A | 9/1987 | Roppel et al. |
| 5,006,363 A | 4/1991 | Fujii et al. |

(Continued)

FOREIGN PATENT DOCUMENTS

| | | |
|---|---|---|
| DE | 195 34 082 A1 | 3/1996 |
| EP | 0 030 798 | 6/1981 |
| EP | 0 306 069 A2 | 3/1989 |
| EP | 0 388 957 A2 | 9/1990 |
| EP | 0 474 140 A1 * | 8/1991 |
| EP | 0 474 140 A1 | 3/1992 |
| EP | 0 810 666 A1 | 12/1997 |
| EP | 0 835 950 A1 | 4/1998 |
| EP | 0 855 735 A2 | 7/1998 |
| EP | 0 892 426 A2 | 1/1999 |
| EP | 0 957 522 A2 | 11/1999 |
| GB | 2 194 555 A | 3/1988 |
| JP | 2250970 | 10/1990 |
| JP | 04-24922 | 1/1992 |
| JP | 04-115533 | 4/1992 |

(Continued)

OTHER PUBLICATIONS

Aoyama et al., "Leakage Current eichanism of Amorphous and Polycrystalline $Ta_2O_3$ Films Grown by chemical Vapor Deposition," 1995, pp. 977–983.

(Continued)

Primary Examiner—Jerome Jackson
Assistant Examiner—Jesse A. Fenty
(74) Attorney, Agent, or Firm—Wells St. John P.S.

(57) ABSTRACT

The invention comprises capacitors having a capacitor dielectric layer comprising a metal oxide having multiple different metals bonded with oxygen. In one embodiment, a capacitor includes first and second conductive electrodes having a high k capacitor dielectric region positioned therebetween. The high k capacitor dielectric region includes a layer of metal oxide having multiple different metals bonded with oxygen. The layer has varying stoichiometry across its thickness. The layer includes an inner region, a middle region, and an outer region. The middle region has a different stoichiometry than both the inner and outer regions.

34 Claims, 3 Drawing Sheets

U.S. PATENT DOCUMENTS

| | | |
|---|---|---|
| 5,164,363 A | 11/1992 | Eguchi et al. |
| 5,183,510 A | 2/1993 | Kimura |
| 5,254,505 A * | 10/1993 | Kamiyama |
| 5,256,455 A | 10/1993 | Numasawa ................. 427/576 |
| 5,261,961 A | 11/1993 | Takasu et al. |
| 5,270,241 A | 12/1993 | Dennison et al. |
| 5,312,783 A | 5/1994 | Takasaki et al. |
| 5,392,189 A | 2/1995 | Fazan et al. |
| 5,395,771 A | 3/1995 | Nakato |
| 5,459,635 A | 10/1995 | Tomozawa et al. ...... 361/321.5 |
| 5,468,687 A | 11/1995 | Carl et al. |
| 5,470,398 A * | 11/1995 | Shibuya et al. |
| 5,525,156 A | 6/1996 | Manada et al. |
| 5,596,214 A | 1/1997 | Endo .......................... 257/324 |
| 5,614,018 A | 3/1997 | Azuma et al. |
| 5,618,761 A | 4/1997 | Eguchi et al. |
| 5,635,741 A * | 6/1997 | Tsu et al. ................... 257/310 |
| 5,656,329 A | 8/1997 | Hampden-Smith |
| 5,663,089 A | 9/1997 | Tomozawa et al. |
| 5,702,562 A | 12/1997 | Wakahara |
| 5,711,816 A | 1/1998 | Kirlin et al. ................ 118/726 |
| 5,719,417 A | 2/1998 | Roeder et al. |
| 5,723,361 A | 3/1998 | Azuma et al. |
| 5,731,948 A | 3/1998 | Yializis et al. .............. 361/313 |
| 5,736,759 A | 4/1998 | Haushaalter |
| 5,776,254 A | 7/1998 | Yuuki et al. ................ 118/725 |
| 5,783,253 A | 7/1998 | Roh ............................ 427/81 |
| 5,798,903 A * | 8/1998 | Dhote et al. ................. 257/310 |
| 5,834,060 A | 11/1998 | Kawahara et al. |
| 5,909,043 A | 6/1999 | Summerfelt |
| 5,972,430 A | 10/1999 | DiMeo, Jr. et al. |
| 5,976,990 A | 11/1999 | Mercaldi et al. |
| 5,989,927 A | 11/1999 | Yamonobe |
| 6,025,222 A | 2/2000 | Kimura et al. |
| 6,037,205 A * | 3/2000 | Huh et al. |
| 6,043,526 A * | 3/2000 | Ochiai ......................... 257/295 |
| 6,046,345 A | 4/2000 | Kadokura et al. ............. 556/1 |
| 6,078,492 A | 6/2000 | Huang et al. ............. 361/301.4 |
| 6,090,443 A | 7/2000 | Eastep |
| 6,101,085 A | 8/2000 | Kawahara et al. |
| 6,126,753 A | 10/2000 | Shinriki et al. |
| 6,127,218 A | 10/2000 | Kang |
| 6,143,679 A | 11/2000 | Nagasawa et al. |
| 6,146,907 A | 11/2000 | Xiang et al. .................... 438/3 |
| 6,150,684 A | 11/2000 | Sone |
| 6,153,898 A * | 11/2000 | Watanabe et al. ........... 257/295 |
| 6,156,638 A * | 12/2000 | Agarwal et al. |
| 6,165,834 A * | 12/2000 | Agarwal et al. |
| 6,211,096 B1 | 4/2001 | Allman et al. |
| 6,215,650 B1 | 4/2001 | Gnade et al. |
| 6,236,076 B1 * | 5/2001 | Arita et al. ................. 257/295 |
| 6,238,734 B1 | 5/2001 | Senzaki et al. ............. 427/266 |
| 6,245,652 B1 | 6/2001 | Gardner et al. |
| 6,258,170 B1 | 7/2001 | Somekh et al. |
| 6,258,654 B1 | 7/2001 | Gocho |
| 6,277,436 B1 | 8/2001 | Stauf et al. |
| 6,285,051 B1 * | 9/2001 | Ueda et al. ................. 257/296 |
| 6,287,935 B1 | 9/2001 | Coursey |
| 6,323,057 B1 | 11/2001 | Sone .......................... 438/104 |
| 6,325,017 B1 | 12/2001 | DeBoer et al. |
| 6,335,049 B1 | 1/2002 | Basceri |
| 6,335,302 B1 | 1/2002 | Satoh et al. |
| 6,337,496 B2 | 1/2002 | Jung |
| 6,338,970 B1 | 1/2002 | Suh |
| 6,362,068 B1 | 3/2002 | Summerfelt et al. ........ 438/396 |
| 6,372,686 B1 | 4/2002 | Golden |
| 6,422,281 B1 | 7/2002 | Ensign, Jr. et al. |
| 6,500,487 B1 | 12/2002 | Holst et al. |
| 6,507,060 B2 | 1/2003 | Ren et al. |
| 6,527,028 B2 | 3/2003 | Miller |
| 6,566,147 B2 | 5/2003 | Basceri et al. |
| 6,602,376 B1 | 8/2003 | Bradshaw |
| 2002/0197793 A1 | 12/2002 | Domfest et al. |

FOREIGN PATENT DOCUMENTS

| | | |
|---|---|---|
| JP | 04-180566 | 6/1992 |
| JP | 6-221446 | 8/1994 |
| JP | 08-060347 | 3/1996 |
| JP | 2000091333 | 3/2000 |
| WO | WO 98/39497 | * 9/1998 |
| WO | WO 99/64645 | * 12/1999 |
| WO | WO 01/16395 | 3/2001 |

OTHER PUBLICATIONS

Stemmer et al., "Accommodation of nonstochiometry in (100) fiber–textured . . . thin films grown by chemical vapor deposition," © 1999 American Institute of Physics, pp. 2432–2434.

Streiffer et al., "Ferroelctricity in thin films: The dielectric response of fiber–textured . . . the films grown by chemical vapor deposition," © 1999 American Institute of Physics, pp. 45654575.

Peter Van Zant, "Microchip Fabrication—Third Edition," © 1997, pp. 319–320.

U.S. Appl. No. 09/905,320, filed Jul. 13, 2001, Basceri et al.

U.S. Appl. No. 09/932,003, filed Aug. 17, 2001, Basceri.

U.S. Appl. No. 09/652,907, filed Aug. 31, 2000, Basceri et al.

U.S. Appl. No. 09/776,217, filed Feb. 2, 2001, Basceri.

C. Basceri et al., "The dielectric response as a function of temperature and film thickness of fiber–textured (Ba,Sr) TIO3 thin films grown by chemical vapor deposition", May 1997, pp. 2497–2504.

Basceri C. "Electrical and Dielectric Properties of (Ba, Sr)TiO$_3$, Thin Film Capactior for Ultra–High Density Dynamic Random Access Memories", 1997, dissertation submitted to Graduate Faculty of N. Carolina State Univ., Dept. of Materials Science and Engineering.

Kim, et al., "Structural and Electrical Properties . . . " Applied Physics Letters, US, American Institute of Physics vol. 65, No. 15, Oct. 10, 1994, pp. 1955–1957.*

Arai T., et al., "Preparation of SrTiO$_3$ Films on 8–Inch Wafers . . . " Jap. Journal of Applied Physics. vol. 35, No. 9B, Part 01, Sep. 1, 1996, pp. 4875–4879.*

U.S. Appl. No. 09/580,733, filed May 26, 2000, Cem Basceri.

U.S. Appl. No. 09/476,516, filed Jan. 3, 2000, Cem Basceri.

U.S. Appl. No. 09/905,286, filed Jul. 13, 2001, Basceri et al.

Choi, Y. C., et al., ABSTRACT, "Improvements of the properties of Chemical–Vapor–Deposited (Ba,Sr) TiO$_3$ Films through Use of a Seed Layer", *Jpn. J. Appl. Phys.*, Part 1, vol. 35, No. 11, pp. 6824–6828 (1997).

Kim, Yong Tae, et al., ABSTRACT, "Advantages of RuO/sub x/Bottom Electrode in the Dielectric and Leakage Characteristics of (Ba,Sr)TiO/sub 3/capacitor", *Jpn. J. Appl. Phys.*, Part 1, vol. 35, No. 12A, pp. 6153–6156 (Dec. 1996).

Jia, Q.X., et al., ABSTRACT, "Structural and Dielectric Properties of Ba/sub 0.5/Sr/sub 0.5/TiO/sub 3/thin films with an epi–RuO/sub 2/bottom electrode", *Integrated Ferroelectrics*, vol. 19, No. 1–4, pp.111–119 (1998).

Chu Chung Ming, et al., ABSTRACT, "Electrical properties and Crystal Structure of (Ba,Sr)TiO/sub 3/films prepared at Low Temperatures on LaNiO/sub 3/electrode by radio–frequency magnetron sputtering ", *Applied Physics Letter*, vol. 70, No. 2, pp. 249–251 (Jan. 13, 1997).

Takeuchi, N., et al. ABSTRACT, Effect of Firing Atmosphere on the Cubic–Hexagonal Transition in Ba/sub 0.99/Sr/sub 0.91/TiO/sub 3/, *Nippon seramikkusu Kyokai Gakujutsu Ronbunshi*, vol. 8, No. 8, pp. 836–839 (1990).

Paek, S.H., et al., ABSTRACT, "Characterization of MIS Capacitor of BST Thin Film Deposited on Si by RF Magnetron Sputtering", *Material. Res. Soc.*, Pittsburgh, PA, *Ferroelectric Thin Films V. Symp.*, pp. 33–38 (Apr. 7, 1996).

Yamaguchi, H., et al., ABSTRACT, Reactive Coevaporation Synthesis and Characterization of SrTiO/sub 3/–BaTiO/sub3/ Thin Films, *I.E.E.E.*, 644 pp. (Aug. 30, 1992).

Yamamichi, S., ABSTRACT, "Ba +Sr)Ti Ratio Dependence of the Dielectric properties for Ba/sub 0.5/)Sr/sub 0.5/TiO/sub 3/ Thin Films Prapared by Ion Beam Sputtering", *Applied Physics Letters*, vol. 64, No. 13, pp. 1644–1646 (Mar. 28, 1994).

Eguchi, et al., ABSTRACT, "Chemical Vapor Deposition of (Ba,Sr)Ti)//3 Thin Films for Application in Gigabit Scale Dynamic Random Access Memories", *Integrated Ferroelectrics*, vol. 14, No. 1–4, Pt. 1, pp.33–42 (1997).

Yamamuka, M., et al., ABSTRACT, "Thermal–Desorption of $(Ba,Sr)TiO_3$ Thin Films Prepared by Chemical–Vapor Deposition", *Japanese Journal of Applied Physics Part I*, vol. 35, No. 2A, pp. 729–735 (Feb. 1996).

Yamamichi, S., et al., ABSTRACT, "Ba +Sr)/Ti Ratio Dependence of the Dielectric properties for (BaSub0Sub.Sub5SrSub0Sub.Sub5)TiO Sub 3 Thin Films Prepared by Ion Beam Sputtering", *Appl. Phys. Letters*, vol. 64(13), pp. 1644–1646 (1994).

Khamankar, Rajesh, et al., "A Novel Low–Temperature Process for High Dielectric Constant BST Thin Films for ULSI DRAM Applications", *Microelectronics Research Center*, Univ. of Texas At Austin, Austin, Tx 2 pp. (Undated).

Kawahara, Takaaki et al., "(Ba, Sr) $TiO_3$ Films Prepared by Liquid Source Chemical Vapor Deposition on Ru Electrodes", *Appl. Phys.*, vol. 35, Pt. 1, No. 9B, pp. 4882–4883 (1996).

Bilodeau, Steve M., et al., ABSTRACT: "MOCVD BST for High Density DRAM Applications", Advanced Technology *Materials, Inc.*, CVD Technologies for Inter–Level Dielectrics and Interconnects Symposium. Danbury CT, 2 pp. (Jul. 12, 1995).

Bilodeau, Steve M., et al., "Composition Dependence of the Dielectric Properties of MOCVD $Ba_xSr_{1-x}TiO_3$", *Applied Technology Materials*, MRS Fall Meeting, pp. 1–21 (Dec. 1, 1994).

* cited by examiner

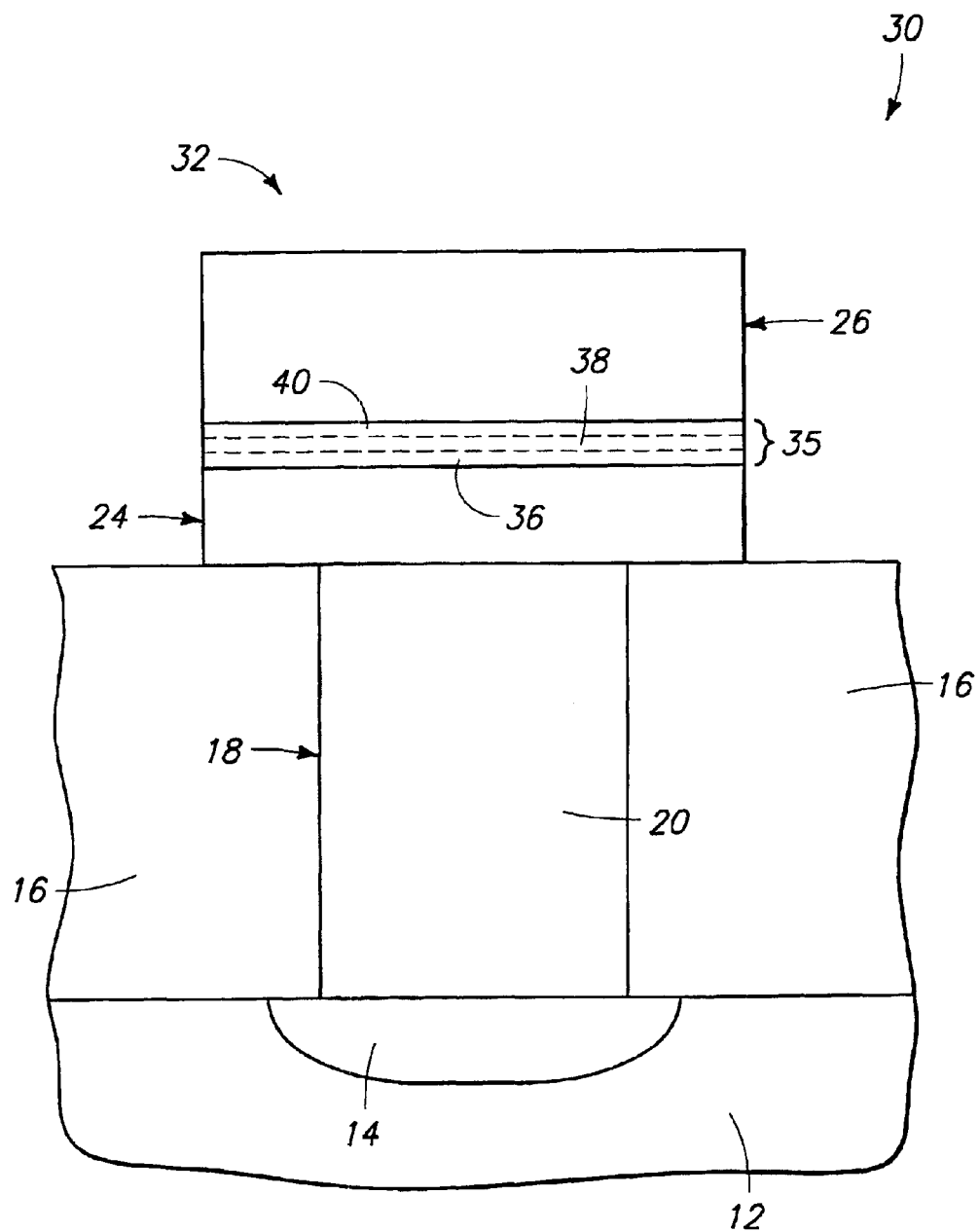

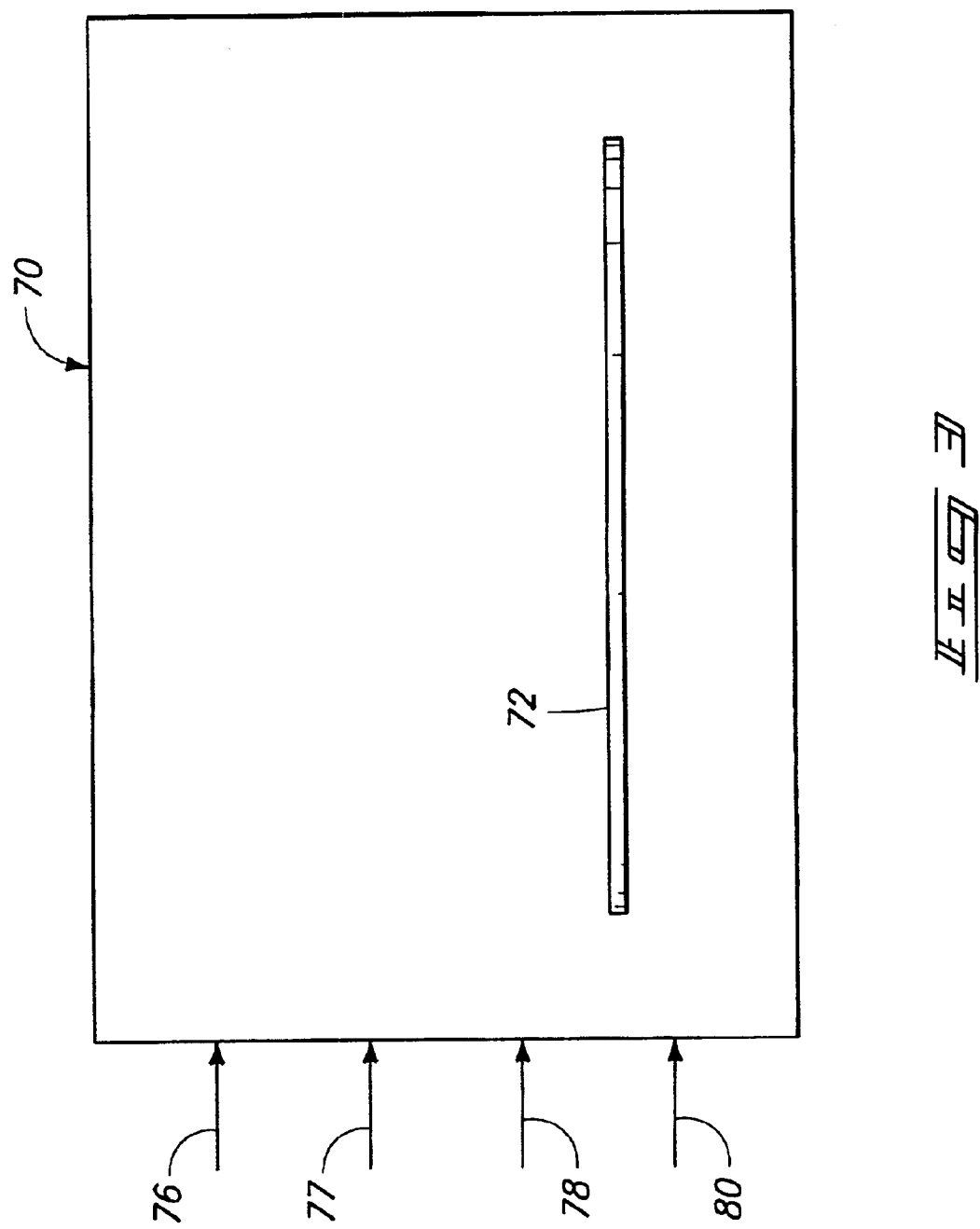

CAPACITORS HAVING A CAPACITOR DIELECTRIC LAYER COMPRISING A METAL OXIDE HAVING MULTIPLE DIFFERENT METALS BONDED WITH OXYGEN

TECHNICAL FIELD

This invention relates to capacitors having a capacitor dielectric layer comprising a metal oxide having multiple different metals bonded with oxygen.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. In the context of this document, "high k" means a material having a dielectric constant of at least 11. Such materials include tantalum pentoxide, barium strontium titanate, strontium titanate, barium titanate, lead zirconium titanate and strontium bismuth titanate. Using such materials enables the creation of much smaller and simpler capacitor structures for a given stored charge requirement, enabling the packing density dictated by future circuit design.

Certain high k dielectric materials have better current leakage characteristics in capacitors than other high k dielectric materials. In some materials, aspects of a high k material which might be modified or tailored to achieve a highest capacitor dielectric constant possible will unfortunately also tend to hurt the leakage characteristics (i.e., increase current leakage). For example, one class of high k capacitor dielectric materials includes metal oxides having multiple different metals bonded with oxygen, such as the barium strontium titanate, lead zirconium titanate, and strontium bismuth titanate referred to above. For example with respect to barium strontium titanate, it is found that increasing titanium concentration as compared to barium and/or strontium results in improved leakage characteristics, but decreases the dielectric constant. Accordingly, capacitance can be increased by increasing the concentration of barium and/or strontium, but unfortunately at the expense of increasing leakage. Further, absence of titanium in the oxide lattice creates a metal vacancy in such multimetal titanates which can increase the dielectric constant, but unfortunately also increases the current leakage.

One method of decreasing leakage while maximizing capacitance is to increase the thickness of the dielectric region in the capacitor. Unfortunately, this is not always desirable. Another prior art method of decreasing leakage is described with respect to FIG. 1. There illustrated is a semiconductor wafer fragment 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A conductive diffusion region 14 is formed within substrate 12. An insulating dielectric layer 16 is formed over substrate 12, and includes an opening 18 formed therein to diffusion region 14. Opening 18 is filled with a suitable conductive material 20, for example conductively doped polysilicon or a metal such as tungsten. Barrier, silicide or other layers might also of course be utilized, but are not otherwise described.

A capacitor construction 22 is formed outwardly of insulating dielectric layer 16 and in electrical connection with conductive plugging material 20. Such comprises an inner capacitor electrode 24, an outer capacitor electrode 26, and a capacitor dielectric region 25 sandwiched therebetween. Capacitor dielectric region 25 comprises a composite of three layers 26, 27 and 28. Region 27 comprises a layer of metal oxide having multiple different metals bonded with oxygen, such as barium strontium titanate, fabricated to provide a stoichiometry which maximizes the dielectric constant of the material. As referred to above, this unfortunately adversely affects the desired leakage properties of the layer. Accordingly, layers 26 and 28 are received outwardly of layer 27 and comprise a material such as $Si_3N_4$ which exhibits extremely low current leakage. Unfortunately, $Si_3N_4$ has a considerably lower dielectric constant than the metal oxides having multiple different metals bonded with oxygen. Such adversely reduces the overall dielectric constant, and accordingly the capacitive effect of capacitor dielectric region 25.

SUMMARY

The invention comprises capacitors having a capacitor dielectric layer comprising a metal oxide having multiple different metals bonded with oxygen. In one embodiment, a capacitor includes first and second conductive electrodes having a high k capacitor dielectric region positioned therebetween. The high k capacitor dielectric region includes a layer of metal oxide having multiple different metals bonded with oxygen. The layer has varying stoichiometry across its thickness. The layer includes an inner region, a middle region, and an outer region. The middle region has a different stoichiometry than both the inner and outer regions.

BRIEF DESCRIPTION OF THE DRAWINGS

Preferred embodiments of the invention are described below with reference to the following accompanying drawings.

FIG. 2 is a diagrammatic sectional view of a semiconductor wafer fragment in accordance with the invention.

FIG. 3 is a diagrammatic view of a chemical vapor deposition chamber utilized in accordance with an aspect of the invention.

DETAILED DESCRIPTION OF THE PREFERRED EMBODIMENTS

Figure 1:
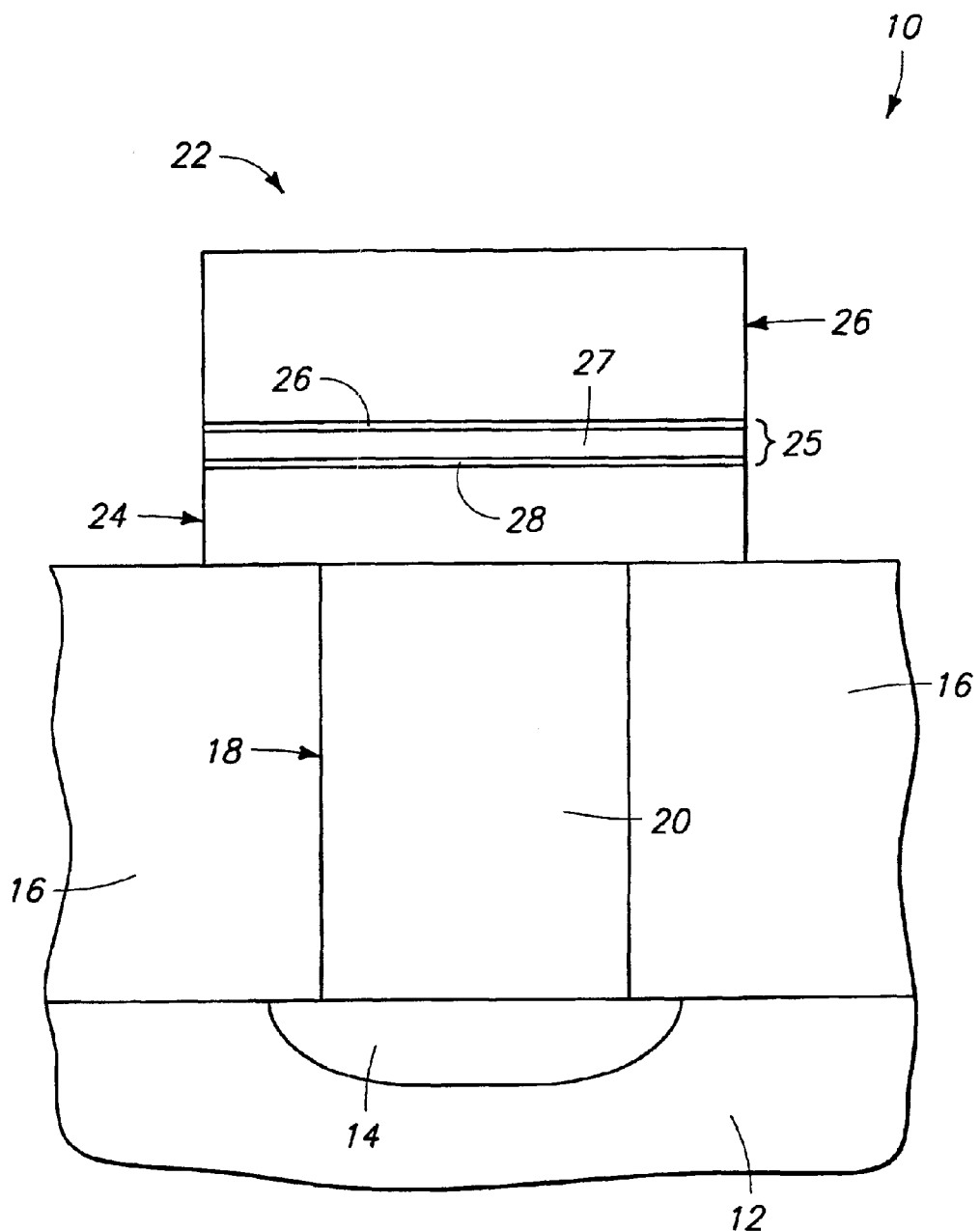
FIG. 1 is a diagrammatic view of a semiconductor wafer fragment processed in accordance with the prior art, as discussed in the "Background" section above.

This disclosure of the invention is submitted in furtherance of the constitutional purposes of the U.S. Patent Laws "to promote the progress of science and useful arts" (Article 1, Section 8).

The invention is described in one exemplary structural embodiment as depicted by FIG. 2. Like numerals from the FIG. 1 prior art embodiment are utilized where appropriate, with differences being indicated with different numerals. FIG. 2 depicts a wafer fragment 30 comprising a capacitor 32 having first and second electrodes 24 and 26. Example and preferred materials for electrodes 24 and 26 include conductively doped polysilicon, conductively doped hemispherical grain polysilicon, platinum, ruthenium, ruthenium oxides, iridium, iridium oxides, palladium, tungsten, tungsten nitride, tantalum nitride, titanium nitride, titanium oxygen nitride, and the like.

A high k capacitor dielectric region 35 is positioned between first capacitor electrode 24 and second capacitor electrode 26. Capacitor dielectric region 35 comprises a layer of metal oxide having multiple different metals bonded with oxygen, for example those materials described above. Most preferably and as shown, capacitor dielectric region 35 consists essentially of such layer, meaning no other layers are received intermediate first electrode 24 and second electrode 26 which meaningfully impact the operation or capacitance of capacitor 32. In accordance with but one aspect of the invention, the metal oxide layer having multiple different metals bonded with oxygen has varying stoichiometry across its thickness. In other words, the stoichiometry in such layer is not substantially constant throughout the layer.

In accordance with but one aspect of the invention, consider a high k capacitor dielectric region comprising a layer of metal oxide having multiple different metals bonded with oxygen. One of the metals when bonded with oxygen has a first current leakage potential, while another of the metals when bonded with oxygen has a second current leakage potential which is greater than the first current leakage potential. By way of example only, consider a titanate, such as barium strontium titanate. Titanium is an example of one metal which when bonded with oxygen has a lower current leakage potential than either barium or strontium when bonded with oxygen. In this embodiment, the layer comprises at least one portion having a greater concentration of the one metal bonded with oxygen which is more proximate at least one of the first and second electrodes than another portion which is more proximate a center of the layer.

By way of example only, capacitor 32 depicts capacitor dielectric region and layer 35 as comprising an inner region 36, a middle region 38, and an outer region 40. Regions 36 and 40 most preferably constitute portions which are fabricated to have a greater concentration of the one metal, in this example titanium, bonded with oxygen than portion 38. Accordingly, regions 40 and 36 are more proximate at least one of the first and second electrodes than is portion 38 more proximate a center of the layer within capacitor dielectric region 35.

Accordingly, the layer or region 35 in this example comprises portions 36 and 40 having a greater concentration of the one metal bonded with oxygen more proximate both the first and second electrodes than the another portion 38 more proximate the center of the layer of capacitor dielectric region 35. Further preferably, region 38 has a greater concentration of the another of the metals (i.e., a greater concentration of one or both of barium and strontium) bonded with oxygen than portions 36 and 40. Further in this preferred example, at least one of portions 36 and 40 (both of such portions as shown) contacts one of the first and second electrodes. As shown, portion 36 contacts electrode 24, while portion 40 contacts electrode 26. Regions 36, 38 and 40 can be fabricated to be the same thickness or different relative thicknesses. Further by way of example only, regions 36 and 40 can be fabricated to comprise essentially the same stoichiometry or different stoichiometries. Accordingly, FIG. 2 depicts but one example where the high k capacitor dielectric region includes a layer where a middle region has a different stoichiometry than both inner and outer regions.

In an additional or alternate aspect or consideration, consider a high k capacitor dielectric region comprising a layer of metal oxide having multiple different metals bonded with oxygen, where one of the metals when bonded with oxygen produces a first material having a first current leakage potential. Further, absence of the one metal in the oxide creates a vacancy and a second material having a second current leakage potential which is greater than the first current leakage potential. An example would be a multiple metal component titanate, such as barium strontium titanate, where the one metal comprises titanium. In accordance with this implementation, the metal oxide layer comprises at least one portion having a greater concentration of the first material which is more proximate at least one of the first and second electrodes than another portion which is more proximate a center of the layer.

Again, FIG. 2 illustrates an exemplary construction, whereby at least one of portions 36 and 40 can be fabricated to have a greater concentration of the first material than another portion 38. Again using barium strontium titanate as an example, titanium constitutes a metal in such material which, when bonded with oxygen, produces greater current leakage potential or resistance than when a vacancy is created in the oxide by absence of the titanium atoms. Accordingly, barium and strontium quantity could essentially be constant throughout the layer of capacitor dielectric region 35, with only the quantity of titanium varying relative to such regions such a described in the preferred example immediately above.

In an additional or alternate considered aspect of the invention, consider a high k capacitor dielectric region comprising a layer of metal oxide having multiple different metals bonded with oxygen, where one of the metals when bonded with oxygen has a first dielectric constant. Another of the metals of such layer when bonded with oxygen has a second dielectric constant which is less than the first dielectric constant. The layer comprises at least one portion having a greater concentration of the one metal bonded with oxygen more proximate a center of the layer than another portion more proximate either of the first and second electrodes. By way of example only, barium strontium titanate constitutes one such material. Specifically, barium and strontium in such material constitutes metals which, when bonded with oxygen, produce a first dielectric constant which is greater than when titanium is bonded with oxygen. Accordingly, and again by way of example only and in reference to the above FIG. 2, region 38 constitutes the one portion 1, having a greater concentration of the one metal (i.e., one or both of barium and strontium) bonded with oxygen which is more proximate a center of the layer.

In an additional or alternate considered aspect of the invention, consider a high k capacitor dielectric region comprising a layer of metal oxide having multiple different metals bonded with oxygen, where one of the metals when bonded with oxygen produces a first material having a first dielectric constant. Absence of the one metal in the oxide creates a vacancy, and a second material having a second dielectric constant which is less than the first dielectric constant. The metal oxide layer comprises at least one portion having a greater concentration of the first material which is more proximate a center of the layer than another portion which is more proximate either of the first and second electrodes.

Again using barium strontium titanate as an example, barium and strontium are example metals whose absence in the lattice when producing vacancies results in a dielectric constant which is less than when present. Accordingly in this example with respect to barium strontium titanate, the one metal comprises at least one of barium and strontium. An exemplary construction encompassing the same is again as depicted in FIG. 2.

The above-described preferred embodiment was with respect to multiple component titanates wherein both the current leakage potential and dielectric constant aspects of the invention are met in the same material. Alternate materials are also, of course, contemplated whereby perhaps only one of the current leakage potential relationship or the capacitor dielectric constant relationship results, with the invention only being limited by the accompanying claims appropriately interpreted in accordance with the Doctrine of Equivalents.

FIG. 3 depicts an exemplary process of depositing a dielectric layer comprising metal oxide having multiple different metals bonded with oxygen in accordance with an aspect of the invention. A chemical vapor deposition chamber 70 has a substrate 72 upon which deposition is desired positioned therein. Exemplary multiple gas inlets 76, 77, 78 and 80 are depicted schematically as extending to chamber 70. Fewer or more gas inlets could, of course, be provided. Further, gases could be mixed further upstream of the schematic depicted by FIG. 3, and flowed as mixtures or combinations relative to one or more inlets.

Multiple gaseous precursors are fed to the chamber under conditions effective to deposit the dielectric layer having multiple different metals bonded with oxygen on substrate 72. At least some of the precursors comprise different metals of the respective multiple different metals bonded with oxygen, which is deposited in the layer on the substrate. As one example, a process for depositing (Ba,Sr) TiO$_3$ includes utilizing precursors of Ba(DPM)$_2$, Sr(DPM)$_2$ and Ti(OC$_3$H$_7$)$_4$, O$_2$ at 0.5 Torr and 410° C., where "DPM" denotes "dipivaloylmethanato". For example, one of each of these gases could be flowed from the respective inlets 76, 77, 78 and 80. In accordance with one implementation, the flow of at least one of the precursors is varied during the feeding to achieve different concentrations of the different metals bonded with oxygen at different depths in the deposited layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising first and second conductive electrodes having a high k capacitor dielectric region positioned therebetween, the high k capacitor dielectric region comprising a layer of metal oxide having multiple different metals bonded with oxygen, one of the metals when bonded with oxygen having a first current leakage potential, another of the metals when bonded with oxygen having a second current leakage potential which is greater than the first current leakage potential, the layer comprising at least one portion having a greater concentration of the one metal bonded with oxygen which is more proximate at least one of the first and second electrodes than another portion more proximate a center of the layer; and wherein the metal oxide with multiple different metals bonded with oxygen comprises a titanate, and the one metal comprises titanium.

2. The capacitor of claim 1 wherein the another portion has a greater concentration of the another of the metals bonded with oxygen than the one portion.

3. The capacitor of claim 1 wherein the layer comprises portions having a greater concentration of the one metal bonded with oxygen more proximate both the first and second electrodes than the another portion more proximate the center of the layer.

4. The capacitor of claim 1 wherein the at least one portion contacts the one electrode.

5. The capacitor of claim 1 wherein the layer comprises portions having a greater concentration of the one metal bonded with oxygen more proximate both the first and second electrodes than the another portion more proximate the center of the layer, said greater concentration portions respectively contacting the first and second electrodes.

6. The capacitor of claim 1 wherein the capacitor dielectric region consists essentially of the layer.

7. A capacitor comprising first and second conductive electrodes having a high k capacitor dielectric region positioned therebetween, the high k capacitor dielectric region comprising a layer of metal oxide having multiple different metals bonded with oxygen, one of the metals when bonded with oxygen producing a first material having a first current leakage potential, absence of the one metal in the oxide creating a vacancy and a second material having a second current leakage potential which is greater than the first current leakage potential, the layer comprising at least one portion having a greater concentration of the first material which is more proximate at least one of the first and second electrodes than another portion more proximate a center of the layer; and wherein the metal oxide with multiple different metals bonded with oxygen comprises a titanate, and the one metal comprises titanium.

8. The capacitor of claim 7 wherein the layer comprises portions having a greater concentration of the first material more proximate both the first and second electrodes than the another portion more proximate a center of the layer.

9. The capacitor of claim 7 wherein the at least one portion contacts the one electrode.

10. The capacitor of claim 7 wherein the layer comprises portions having a greater concentration of the first material more proximate both the first and second electrodes than the another portion more proximate a center of the layer, said greater concentration portions respectively contacting the first and second electrodes.

11. The capacitor of claim 7 wherein the capacitor dielectric region consists essentially of the layer.

12. The capacitor of claim 7 wherein the capacitor is formed over a substrate and devoid of intermediate layers between one of the first and second conductive electrodes and the substrate.

13. A capacitor comprising first and second conductive electrodes having a high k capacitor dielectric region positioned therebetween, the high k capacitor dielectric region comprising a layer of metal oxide having multiple different metals bonded with oxygen, one of the metals when bonded with oxygen having a first dielectric constant, another of the metals when bonded with oxygen having a second dielectric constant which is less than the first dielectric constant, the layer comprising at least one portion having a greater concentration of the one metal bonded with oxygen more proximate a center of the layer than another portion more proximate either of the first and second electrode; and wherein the metal oxide with multiple different metals bonded with oxygen comprises a titanate, and the another metal comprises titanium.

14. The capacitor of claim 13 wherein the another portion contacts one of the first and second electrodes.

15. The capacitor of claim 13 wherein the another portion has a greater concentration of the another of the metals bonded with oxygen than the one portion.

16. The capacitor of claim 13 wherein the layer comprises portions having a greater concentration of the another metal bonded with oxygen more proximate both the first and second electrodes than the one portion more proximate the center of the layer, said greater concentration portions respectively contacting the first and second electrodes.

17. The capacitor of claim 13 wherein the capacitor dielectric region consists essentially of the layer.

18. The capacitor of claim 13 wherein the metal oxide with multiple different metals bonded with oxygen comprises barium strontium titanate, and the one metal comprised at least one of barium and strontium.

19. The capacitor of claim 13 wherein the capacitor is formed over a substrate and devoid of intermediate layers between one of the first and second conductive electrodes and the substrate.

20. A capacitor comprising first and second conductive electrodes having a high k capacitor dielectric region positioned therebetween, the high k capacitor dielectric region comprising a layer of metal oxide having multiple different metals bonded with oxygen, one of the metals when bonded with oxygen producing a first material having a first dielectric constant, absence of the one metal in the oxide creating a vacancy and a second material having a second dielectric constant which is less than the first dielectric constant, the layer comprising at least one portion having a greater concentration of the first material which is more proximate a center of the layer than another portion more proximate either of the first and second electrodes; and wherein the metal oxide with multiple different metals bonded with oxygen comprises barium strontium titanate, and the one metal comprises at least one of barium and strontium.

21. The capacitor of claim 20 wherein the layer comprises portions having a greater concentration of the first material more proximate both the first and second electrodes than the another portion more proximate a center of the layer.

22. The capacitor of claim 20 wherein the another portion contacts the one electrode.

23. The capacitor of claim 20 wherein the layer comprises portions having a greater concentration of the another material more proximate both the first and second electrodes than the one portion more proximate a center of the layer, said greater concentration portions respectively contacting the first and second electrodes.

24. The capacitor of claim 20 wherein the capacitor dielectric region consists essentially of the layer.

25. The capacitor of claim 20 wherein the metal oxide with multiple different metals bonded with oxygen comprises a titanate.

26. The capacitor of claim 20 wherein the capacitor is formed over a substrate and devoid of intermediate layers between one of the first and second conductive electrodes and the substrate.

27. A capacitor comprising first and second conductive electrodes having a high k charge storage dielectric region positioned therebetween, the high k charge storage dielectric region comprising a layer of metal oxide having multiple different metals bonded with oxygen, the layer having varying stoichiometry across its thickness, the layer comprising an inner region, a middle region, and an outer region, the middle region having a different stoichiometry than both the inner and outer regions, wherein the electrodes comprise material of at least one of conductively doped polysilicon, conductively doped hemispherical grain polysilicon, tungsten, tungsten nitride, and titanium oxygen nitride.

28. The capacitor of claim 1 wherein the capacitor is formed over a substrate and devoid of intermediate layers between one of the first and second conductive electrodes and the substrate.

29. The capacitor of claim 27 wherein the capacitor is formed over a substrate and devoid of intermediate layers between one of the first and second conductive electrodes and the substrate.

30. A capacitor comprising:

first and second conductive electrodes; and a high k capacitor dielectric region positioned between the first and the second conductive electrodes, the high k capacitor dielectric region comprising a layer of metal oxide having multiple different metals bonded with oxygen, one of the metals having a first concentration within one portion of the layer and comprising a first dielectric constant, the layer comprising another portion with the one of the metals having a second concentration and comprising a second dielectric constant which is greater than the first dielectric constant, the second concentration comprising a greater concentration of the one metal than the first concentration of the one metal.

31. The capacitor of claim 30 wherein the one metal comprises at least one of barium and strontium.

32. The capacitor of claim 30 wherein the one metal comprises barium.

33. The capacitor of claim 30 wherein the one metal comprises strontium.

34. The capacitor of claim 30 wherein the layer of metal oxide comprises barium strontium titanate.

* * * * *

UNITED STATES PATENT AND TRADEMARK OFFICE
CERTIFICATE OF CORRECTION

| | | |
|---|---|---|
| PATENT NO. | : 6,943,392 B2 | Page 1 of 1 |
| APPLICATION NO. | : 09/388063 | |
| DATED | : September 13, 2005 | |
| INVENTOR(S) | : Agarwal et al. | |

It is certified that error appears in the above-identified patent and that said Letters Patent is hereby corrected as shown below:

Title Page 3, "References Cited", "OTHER PUBLICATIONS", Col. 2, lines 1-5, please delete "Yamamichi, S., et al., ABSTRACT, "Ba +Sr)/Ti Ratio Dependence of the dielectric properties for (BaSub0Sub.Sub5SrSub0.Sub5)TiO Sub 3 thin Films Prepare by Ion Beam Sputtering", *Appl. Phys Letters*, col. 64(13), pp. 1644-1646 (1994)."

Col. 8, line 31, claim 27, please insert --tantalum nitride, titanium nitride,-- after "tungsten nitride,".

Signed and Sealed this

Fifteenth Day of August, 2006

JON W. DUDAS
*Director of the United States Patent and Trademark Office*